United States Patent [19]

Benden et al.

[11] 4,148,275

[45] Apr. 10, 1979

[54] APPARATUS FOR GAS PHASE DEPOSITION OF COATINGS

[75] Inventors: Robert S. Benden, Manchester; Richard S. Parzuchowski, Bethel, both of Conn.

[73] Assignee: United Technologies Corporation, Hartford, Conn.

[21] Appl. No.: 836,879

[22] Filed: Sep. 26, 1977

Related U.S. Application Data

[63] Continuation-in-part of Ser. No. 661,903, Feb. 25, 1976.

[51] Int. Cl.$^2$ ............................................. C23C 13/03
[52] U.S. Cl. .................................... 118/49.5; 427/237
[58] Field of Search .................... 118/7, 48, 49, 49.1, 118/49.5; 427/237

[56] References Cited

U.S. PATENT DOCUMENTS

| | | | |
|---|---|---|---|
| 573,206 | 12/1896 | Chavez et al. | 118/48 |
| 3,184,348 | 5/1965 | Marinace | 118/49.5 UX |
| 3,472,679 | 10/1969 | Ing, Jr. et al. | 118/49.5 X |
| 3,558,376 | 1/1971 | Schmidt et al. | 118/49.1 UX |
| 3,594,242 | 7/1971 | Burd et al. | 118/49.1 X |
| 3,617,371 | 11/1971 | Burmeister, Jr. | 118/49.5 X |
| 3,635,771 | 1/1972 | Shaw | 118/49.5 UX |
| 3,894,164 | 7/1975 | Dismukes et al. | 427/248 A |
| 4,063,974 | 12/1977 | Fraas | 427/248 A |

*Primary Examiner*—Wm. Carter Reynolds
*Attorney, Agent, or Firm*—Edward J. Timmer

[57] ABSTRACT

Disclosed is an improved apparatus for depositing a coating on the internal surfaces of hollow articles by gas phase deposition. The apparatus typically includes a sheet metal enclosure having a manifold member which defines a first and second chamber therein. The first chamber is adapted to contain a powder mixture for generating a coating gas whereas the second chamber is adapted to house the articles to be coated. The manifold member includes hollow tubes or other connector means extending therethrough to connect the interior of the articles in gas flow relation to the first chamber where the coating gas is generated. A source external of the enclosure supplies carrier gas to the first chamber at a controlled flow rate via tube means. The carrier gas transports the coating gas generated in the first chamber through the manifold tubes and then into the internal passages of the article to effect deposition. The positive flow of coating gas through the internal passages provides a substantially uniform coating thickness over the entire internal surface area of each article.

4 Claims, 1 Drawing Figure

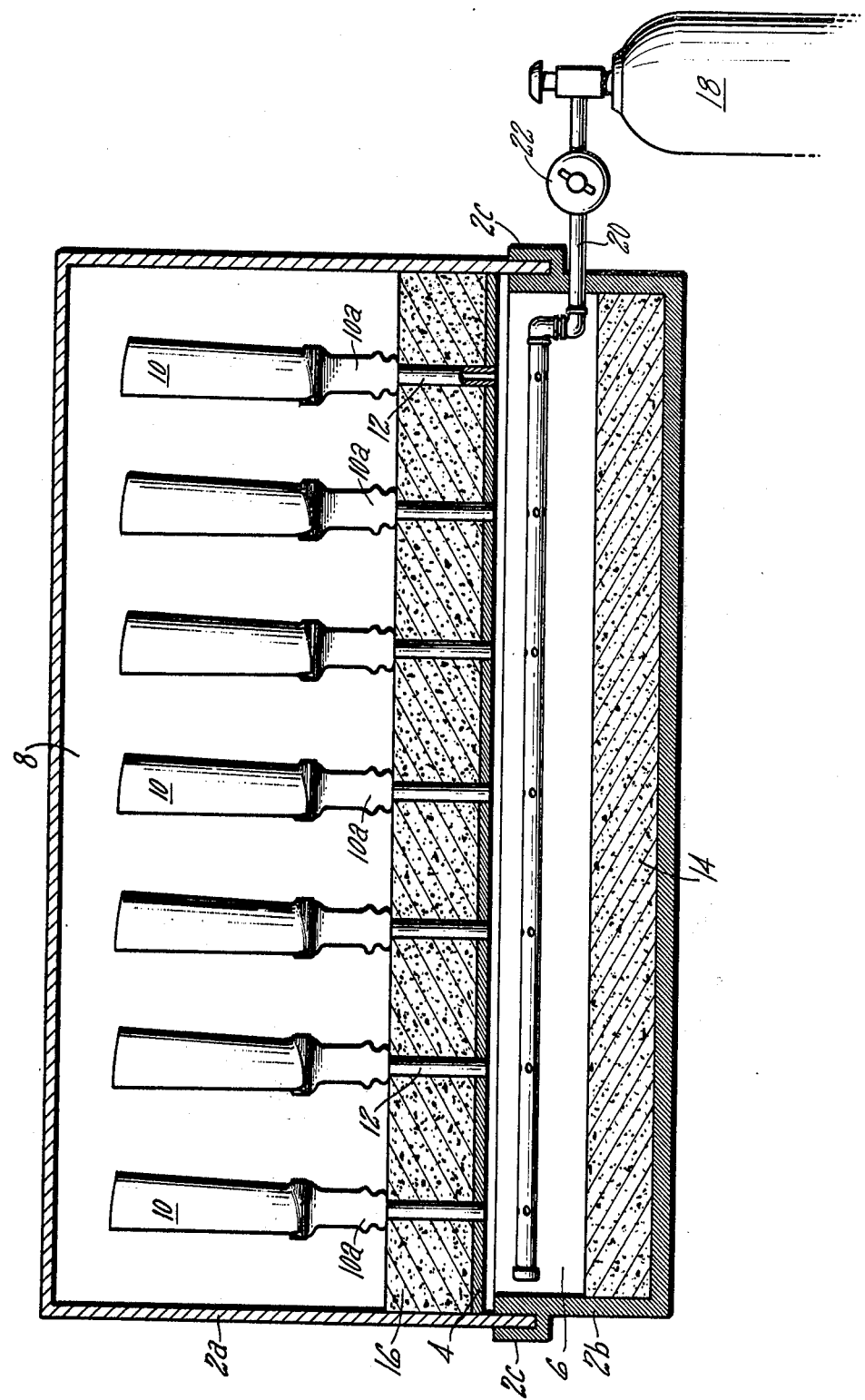

APPARATUS FOR GAS PHASE DEPOSITION OF COATINGS

BACKGROUND OF THE INVENTION

This application is a continuation-in-part of application U.S. Ser. No. 661,903 pending, filed Feb. 25, 1976.

FIELD OF THE INVENTION

The present invention relates to coating apparatus and, more particularly, to apparatus useful for the gas phase deposition of metallic coatings, such as aluminum coatings, on the internal surfaces of hollow articles.

DESCRIPTION OF THE PRIOR ART

The aluminizing process is well known to the art for improving the corrosion resistance of many substrates such as alloys containing chromium, iron, nickel or cobalt, for example, as the major constituent and in particular, improving the properties of the nickel-and cobalt-based superalloys which are used in high-temperature environment, such as gas turbine blades and vanes. In a typical aluminizing process, the part to be aluminized is embedded in a powder pack containing aluminum, either as the metal or alloyed with another metal such as cobalt, for example, a carrier, typically an ammonium or alkali metal halide, and an inert filler such as alumina. The part is embedded in this pack and heated to 1200° F.–2200° F. to coat the external surface of the part with aluminum, the thickness of the coating depending upon the time and temperature of treatment. In this process, the halide acts as a carrier or activator to facilitate the transfer of the aluminum from the source of the aluminum to the part. Representative patents showing these types of pack cementation processes are those to Puyear et al, U.S. Pat. No. 3,079,276 dated Feb. 26, 1963, for Vapor Diffusion Coating Process; Fitzer, U.S. Pat. No. 2,886,469 May 12, 1959, for Method of Coating Metallic Bodies With Aluminum Utilizing Vaporous SubChlorides; Zupan, U.S. Pat. No. 3,335,028 dated Aug. 8, 1967, for Complex Fluoro Salt Cementation Method For Coating Refractory Metallic Substrates; Brill-Edwards U.S. Pat. No. 3,693,255 dated Sept. 26, 1972, for Method For Coating Heat Resistant Alloys and Speirs et al U.S. Pat. No. 3,764,373 dated Oct. 9, 1973, for Diffusion Coating Of Metals.

When internal passages are required to be coated using the pack process, difficulties are encountered because the internal passages, which in many cases are quite small, must be filled with the pack powder mixture and after treatment, these internal passages must be cleaned of any residual pack powder mixture. In addition, coating deposition is effected by the ratio of pack powder to surface area to be coated. Therefore, internal part geometry affects the thickness of coating deposited.

A gas deposition process for coating external surfaces of articles is described in the patent to Gauje No. 3,486,927 dated Dec. 30, 1969, for Process For Depositing A Protective Aluminum Coating On Metal Articles. This technique involves suspending the article to be coated outside of a powder mixture and causing an aluminum-bearing gas to flow around the article to effect deposition on the external surfaces.

SUMMARY OF THE INVENTION

The present invention provides an improved apparatus useful for depositing a metallic coating on the internal surfaces of hollow articles by gas phase deposition processes. The invention is especially useful in coating articles of highly complex internal geometry, such as gas turbine blades and vanes having internal cooling passages, with oxidation and/or corrosion resistant coatings, such as aluminum, chromium and like coatings.

In a typical embodiment of the invention, the apparatus includes a sheet metal enclosure having a manifold member therein to define a first and second chamber. The first chamber is adapted to contain a source of coating gas, such as a powder mixture, whereas the second chamber is adapted to house the articles to be coated. The manifold member, which may be a metal plate or the like, includes means for connecting the interior of the articles in gas flow relation with the first chamber containing the powder mixture. Typically, the connector means includes hollow tube members extending through the manifold member, the tubes having one end opening into the first chamber and the other end opening into the interior of the articles. As usual in the prior art, the powder mixture is heated to generate the coating gas and effect deposition on the internal surfaces of the articles to be coated. To this end, the enclosure is adapted, such as by being made of oxidation resistant sheet metal, for insertion in a furnace or similar heating means. A positive flow of the coating gas through the interior of the articles is provided by carrier gas means which typically includes a source of carrier gas external of the enclosure, control means for regulating flow rate of the gas and tube means connecting the gas source to the first chamber where the coating gas is generated. The carrier gas is introduced into the first chamber at a controlled rate and carries or transports the coating gas through the connector means and then through the internal passages of each article. This positive flow of coating gas through the articles causes a uniform coating to be deposited over the entire internal surface area.

In a preferred embodiment, the second chamber within the enclosure is also adapted to contain a second source of coating gas to effect deposition of a coating on the external surface of the article simultaneous with deposition of the internal coating.

These and other advantages and objects of the invention will become more fully apparent from the following drawing and detailed description of preferred embodiments.

BRIEF DESCRIPTION OF THE DRAWING

The FIGURE is a schematic view of a typical apparatus of the invention.

DESCRIPTION OF THE PREFERRED EMBODIMENTS

The apparatus described hereinbelow has general applicability to any process for coating the internal surfaces of articles by gas phase deposition. A preferred apparatus of the invention is shown schematically in the FIGURE. The apparatus includes a sheet metal or other enclosure which for the sake of convenience is fabricated in two sections, an upper section 2a and lower section 2b, the upper section typically resting on flange 2c when assembled in working relationship and including suitable vent means, such as holes, slots and the like for allowing escape of spent coating gas after it passes through the articles. A manifold member in the form of metal plate 4 extends across the enclosure to define a lower chamber 6 and upper chamber 8. Of course, metal plate 4 may be welded or otherwise attached to either the upper or lower section of the enclosure. In coating the internal surfaces of a plurality of hollow articles, such as turbine blades 10, the metal plate includes gas transport tubes 12 extending therethrough, each tube having one end opening into and in gas flow communication with lower chamber 6 where the coating gas is generated and the other end opening into and in gas flow communication with the interior of the articles to be coated. Typically, the upper end of each gas transport tube is inserted into the open end of root 10a of each blade or vane to effect communication. Of course, other tube configurations may be utilized.

Lower chamber 6 is adapted to contain a source of coating gas, such as powder coating mixture 14 which, when heated in conventional fashion, generates the desired coating gas, an example of which is the powder mixture of copending application Ser. No. 661,903, cited above, for depositing aluminum on superalloy substrates. Upper chamber 8 is configured to accommodate the articles to be coated out of contact of the furnace atmosphere and also may contain another source of coating gas, powder mixture 16, for depositing a coating on the exterior surface of each article simultaneous with the internal coating. If desired, powder mixture 16 may fill the entire upper chamber 8 to embed the exterior surfaces of the turbine blade for coating.

An external source 18 of carrier gas, for example argon, is connected to the lower chamber via carrier tube 20, the portion of the tube inside the lower chamber having a plurality of holes through which the carrier gas is introduced into the chamber and referred to hereafter as a horizontal injection tube. Generally, a conventional flow rate control device 22 is disposed between the carrier gas source and the chamber. Device 22 in conjunction with tubes 12, whose cross-section can be varied, provides controlled flow of carrier gas into chamber 6, through tubes 12 and into the internal turbine blade passages. This positive controlled flow of carrier gas transports the coating gas generated in the lower chamber in prescribed amounts throughout the internal blade passages to deposit a coating of substantial uniform thickness over the entire internal surface area. Control of coating thickness can be regulated by varying the flow rate of carrier gas, the cross-section of tubes 12 and the composition of the powder coating mixture.

Actual coating is effected by placing the apparatus of the FIGURE in a furnace or other suitable heating means to heat the powder pack and articles to be coated. Typical temperatures may be 1800° –2200° F. Therefore, the enclosure and other components of the apparatus are preferably made from heat resisting materials, such as Inconel 600.

Although the invention has been shown and described with respect to preferred embodiments, those skilled in the art will recognize that other changes, additions and omissions in the form and detail thereof can be made without departing from the spirit and scope of the invention.

Having thus described typical embodiments of our invention, that which we claim as new and desire to secure by Letters Patent of the United States is:

1. An apparatus useful for simultaneously coating the internal and external surfaces of a plurality of hollow articles, comprising:
    (a) an enclosure having a manifold member therein to define a lower and upper chamber, the lower chamber being adapted to contain a first source of coating gas and the upper chamber being adapted to house the articles to be coated and to contain a second source of coating gas, the manifold member including connector means for connecting the interior of each article in gas flow relation with the lower chamber, said enclosure being adapted for insertion in heating means so that said first and second sources of coating gas can be heated for generating a first coating gas in the lower chamber to coat the internal article surfaces and a second coating gas in the upper chamber to coat the external article surfaces; and
    (b) carrier gas means for supplying a carrier gas to the lower chamber at a controlled flow rate, the carrier gas transporting the first coating gas generated in the lower chamber through the connector means and then into the articles at a controlled flow rate to deposit a coating of desired thickness substantially uniformly on the internal surfaces while the external surfaces are coated by the second coating gas generated in the upper chamber.

2. The apparatus of claim 1 wherein the connector means includes a plurality of upwardly oriented hollow tubes through the manifold member, each tube opening at its lower end into the lower chamber above the first source of coating gas and at its upper end into the interior of an article to be coated for directing the coating and carrier gas therein.

3. An apparatus useful for the gas phase deposition of a coating on the interior surfaces of a plurality of hollow articles, comprising:
    (a) an enclosure having a manifold member therein to define a lower and upper chamber, the lower chamber being adapted to contain a first source of coating gas and the upper chamber being adapted to house the articles to be coated, and connector means in the form of a plurality of upwardly oriented hollow tubes extending through the manifold member, each tube opening at its lower end into the lower chamber above the source of coating gas and at its upper end into the interior of an article to be coated whereby said hollow tubes can direct gas from the lower chamber into the articles to be coated, and
    (b) carrier gas means for supplying a carrier gas to the lower chamber at a controlled flow rate, the carrier gas transporting the coating gas generated in said lower chamber through the upwardly oriented hollow tubes and then into each of the articles to be coated at a controlled flow rate to deposit a coating of desired thickness substantially uniformly on the interior article surfaces.

4. The apparatus of claim 3 wherein the carrier gas means includes a source of carrier gas external of said enclosure, means for controlling the gas flow rate, and tube means extending from the carrier gas source into the lower chamber, said tube means including a substantially horizontal injection tube in the lower chamber above the coating gas source and below the lower ends of the hollow tubes, the injection tube having a plurality of openings therein for introducing the carrier gas into the chamber from the carrier gas source.

* * * * *